United States Patent
Schmajew

(10) Patent No.: US 11,877,518 B2
(45) Date of Patent: Jan. 16, 2024

(54) PACKAGE FOR ELECTRIC DEVICE AND METHOD OF MANUFACTURING THE PACKAGE

(71) Applicant: RF360 SINGAPORE PTE. LTD., Singapore (SG)

(72) Inventor: Alexander Schmajew, Munich (DE)

(73) Assignee: RF360 SINGAPORE PTE. LTD., Singapore (SG)

( * ) Notice: Subject to any disclaimer, the term of this patent is extended or adjusted under 35 U.S.C. 154(b) by 527 days.

(21) Appl. No.: 17/044,780

(22) PCT Filed: Mar. 28, 2019

(86) PCT No.: PCT/EP2019/057881
§ 371 (c)(1),
(2) Date: Oct. 1, 2020

(87) PCT Pub. No.: WO2019/197166
PCT Pub. Date: Oct. 17, 2019

(65) Prior Publication Data
US 2021/0111330 A1    Apr. 15, 2021

(30) Foreign Application Priority Data
Apr. 11, 2018   (DE) .......................... 102018108611.3

(51) Int. Cl.
*H10N 30/87* (2023.01)
*H01L 23/538* (2006.01)
(Continued)

(52) U.S. Cl.
CPC ....... *H10N 30/872* (2023.02); *H01L 23/5384* (2013.01); *H01L 23/5386* (2013.01);
(Continued)

(58) Field of Classification Search
CPC .. H03H 9/0296; H03H 9/02015; H10N 30/06; H10N 30/00; H10N 30/872; H01L 24/14; H01L 213/5386; H01L 213/5384
See application file for complete search history.

(56) References Cited

U.S. PATENT DOCUMENTS 9,130,539 B2 *  9/2015  Kikuchi ............... H03H 9/0576
2004/0016942 A1 *  1/2004  Miyazawa ............. H01L 24/13
257/E21.597
(Continued)

OTHER PUBLICATIONS

International Search Report and Written Opinion dated Jul. 11, 2019, corresponding to Application No. PCT/EP2019/057881.

*Primary Examiner* — J. San Martin
(74) *Attorney, Agent, or Firm* — Patterson + Sheridan, L.L.P.

(57) ABSTRACT

A package for an electric device is proposed based on a substrate (SU, SU1, SU2) that comprises at least a piezo-electric layer. Device structures are enclosed in a cavity of an integrally formed package layer structure (PK) of a thin film package applied on the first surface (SI). A first contact pad (PI) is arranged on the first surface of the substrate and electrically connected to the device structures. A second contact pad (P2) is arranged on a second surface (S2) of the substrate opposite to the first surface (SI). A via (V) is guided through the substrate and interconnects first and second contact pads electrically. Packages may be stacked on one another and connected via two pads of different kind. The first substrate (SU1) is connected via its second pad (P2) on the second surface thereof to the first pad of a second substrate (SU2) by means of connection means (CM).

16 Claims, 3 Drawing Sheets

(51) Int. Cl.
     *H01L 23/00*     (2006.01)
     *H03H 9/02*      (2006.01)
     *H10N 30/00*     (2023.01)
     *H10N 30/06*     (2023.01)

(52) U.S. Cl.
     CPC ......... *H01L 24/14* (2013.01); *H03H 9/02015* (2013.01); *H03H 9/0296* (2013.01); *H10N 30/00* (2023.02); *H10N 30/06* (2023.02)

(56) References Cited

U.S. PATENT DOCUMENTS

| | | | |
|---|---|---|---|
| 2010/0045145 A1* | 2/2010 | Tsuda | H03H 9/1085 29/25.35 |
| 2011/0006381 A1* | 1/2011 | Feiertag | B81B 7/007 438/51 |
| 2011/0227220 A1 | 9/2011 | Chen et al. | |
| 2015/0380634 A1 | 12/2015 | Henn et al. | |
| 2016/0173059 A1* | 6/2016 | Schmidhammer | H03H 9/0552 310/314 |
| 2017/0179920 A1 | 6/2017 | Kawasaki | |
| 2018/0013055 A1* | 1/2018 | Metzger | H10N 30/10513 |

* cited by examiner

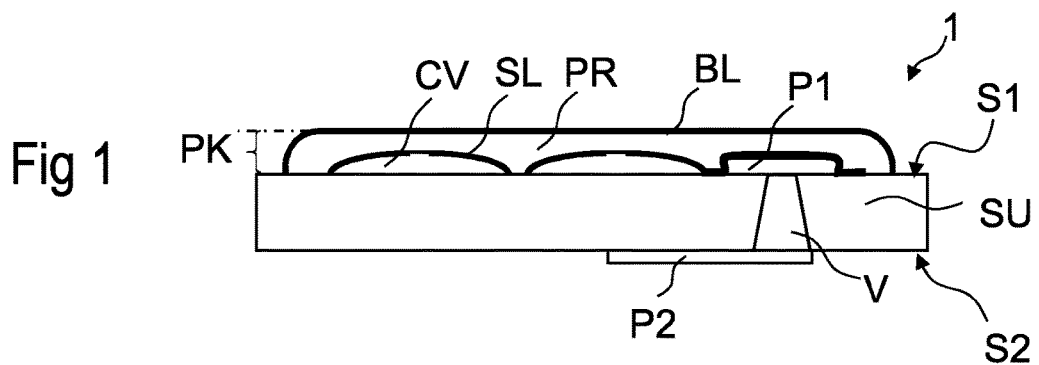
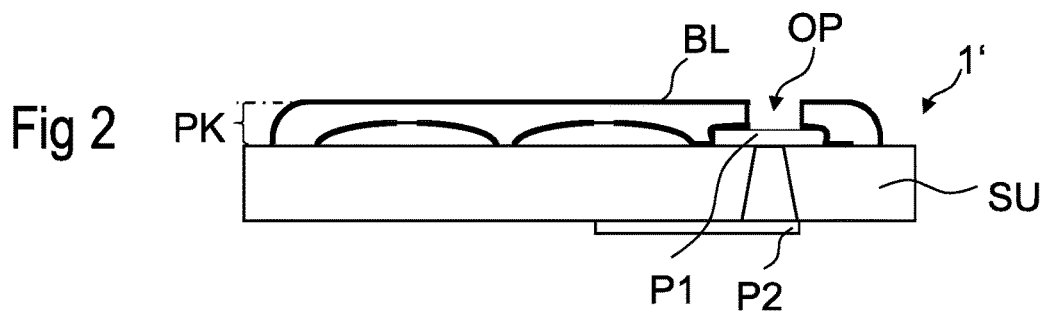
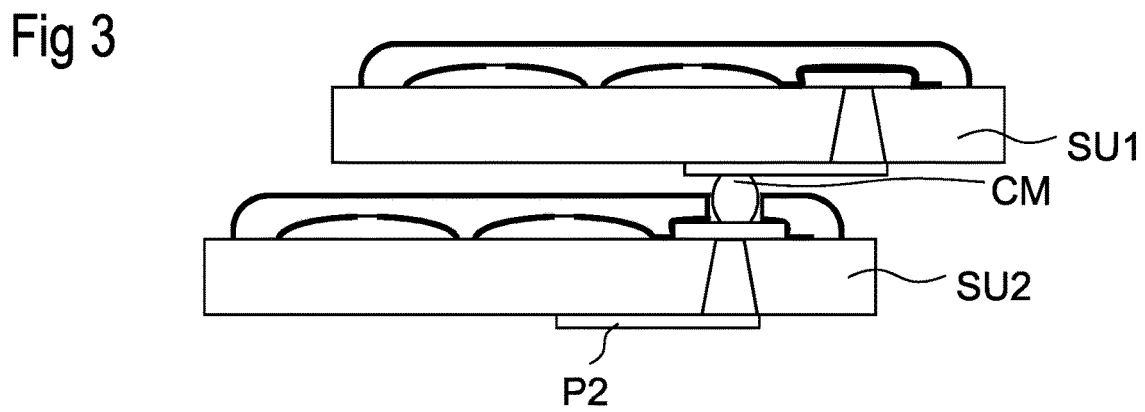
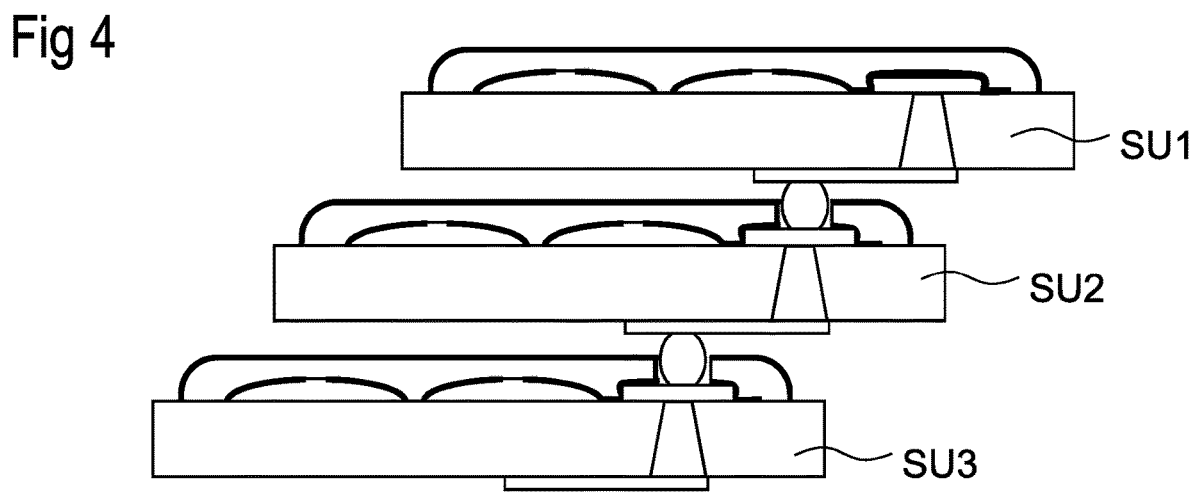

Fig 5
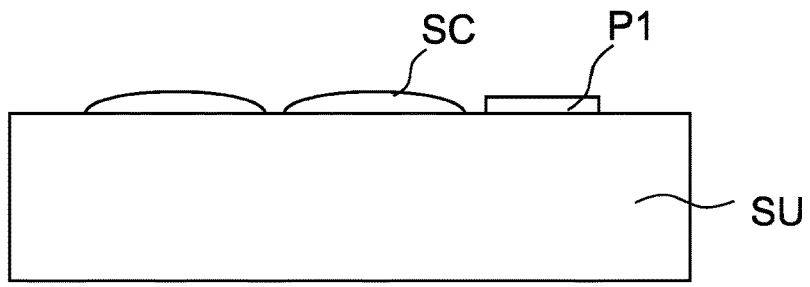
a)
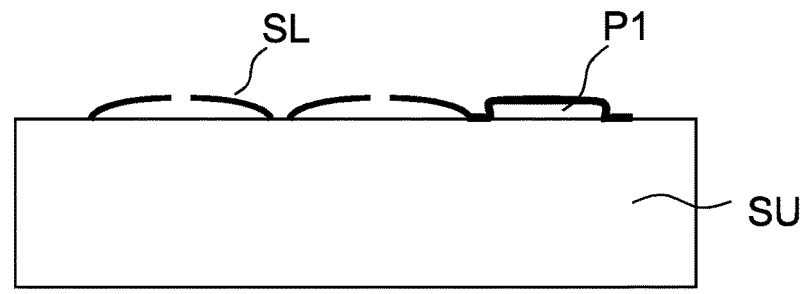
b)
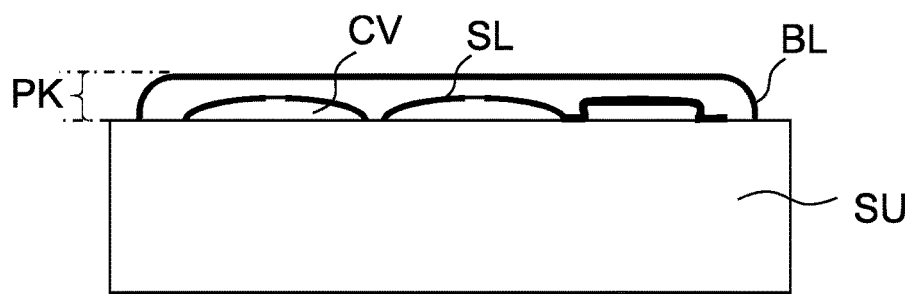
c)
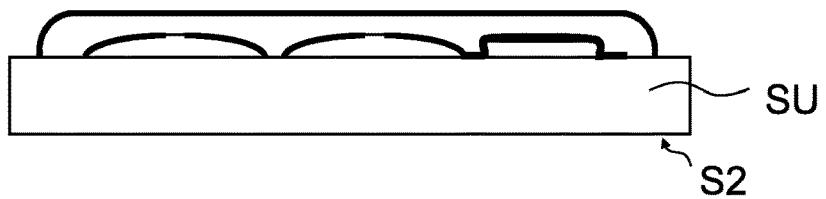
d)
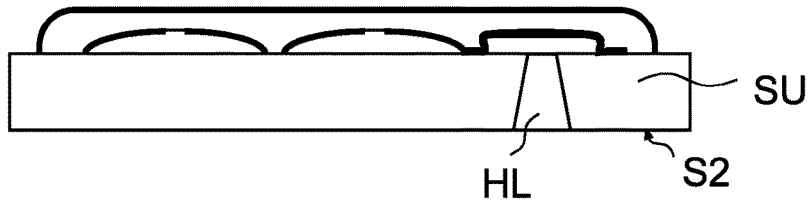
e)
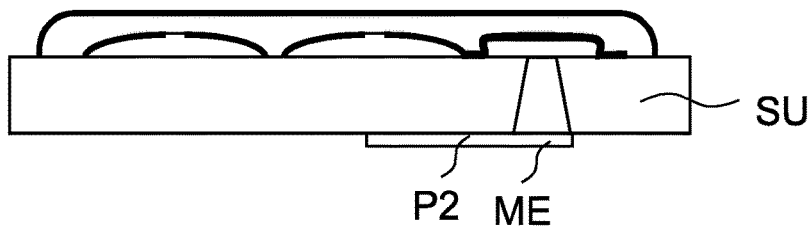
f)

PACKAGE FOR ELECTRIC DEVICE AND METHOD OF MANUFACTURING THE PACKAGE

CROSS-REFERENCE TO RELATED APPLICATIONS

This application is a national stage application under 35 U.S.C. 371 of PCT/EP2019/057881, filed Mar. 28, 2019, which claims the benefit of German Application No. 102018108611.3, filed Apr. 11, 2018, both of which are incorporated herein by reference in their entireties.

The invention relates to an electric device package having improved external contacts and a method of manufacturing the package. The package may be used as a cavity package for SAW and BAW devices and provides the ability to contact device chips from the back and to build multilevel SiP (=system-in-package) in WLP (=wafer level packaging) technology.

Continuous miniaturization of electric devices in micro and nano electronics demands devices and device chips having smallest possible area consumption for electric conductors and contact pads. On the other hand, highest flexibility of device design is required to allow easy integration of the device in an electronic system. Upcoming 3D packaging methods, like system-in-package (SiP), aggravate the problem additionally. In an SiP package the electric device chips are not only arranged one adjacent to the other but also one above the other to form multilevel device modules.

Thin Film Packaging (also named TFP, or Thin Film Capping) is a technology providing lowest package height, smallest area, low thermal budget, and relative low cost compared to other packaging technologies.

The smallest device package on the market can be realized in a wafer level packaging technique (WLP). In this technology, device structures to be protected are arranged in cavities produced integrally on a wafer-level. This can be done for example by covering the device structures with a structured sacrificial layer. After structuring, only those device structures that need to be enclosed within a cavity are covered by the sacrificial material. A mechanically stable layer is deposited onto this material to form a mechanically stable cap. Through an opening in this cap the sacrificial material is removed before the opening is closed again. In alternative processes capping layer with preformed recesses can be used to form cavities.

To hermetically close the holes a polymer layer can be deposited above the cap to close the release holes. Alternately, a PSG (phosphorous-doped silicate glass) layer can be used for this purpose. Additional package layers may be applied onto the mechanically stable layer.

This technique allows to mechanically and electrically connect different chips together by wafer bonding and integrate them into a common system. With this technique it is possible to produce the most compact SiPs at this time. The most demanding task for forming such an SiP is the manufacturing of the three-dimensional electric connecting lines in view of designing such a device and for designing a process for manufacturing.

From the international patent application WO 2015/082952 A1 a MEMS device and another electronic device that is packaged in a wafer level packaging technique and a method of manufacturing is known.

In current solutions special contact pads are required that have to be provided on the top surface of the chip adjacent to the device structures. Known methods for forming SiP packages are handling single chips to build up a three-dimensional chip arrangement. These techniques do not allow to build up an SiP on a wafer level but only on a chip level.

TFP package currently used for SAW and BAW filters and duplexers shows following weak points:
- UBM pads require large area on the active surface of SAW chip
- Limited flexibility for UBM pad positions leads to less design flexibility.
- Hermeticity is limited through openings in SiN layer for UBM
- Large domes cannot be supported by pillars and tend to crack.
- Lower stand-off due to dome topography.
- No metal shielding for active structures is available.

It is an object of the present application to provide an electric device that is able to be processed on a wafer level and a method for manufacturing that package. It is a further object to provide a packaging technique that can be performed on a wafer level.

These and other objects are met by a package according to certain embodiments of the present disclosure. Sophisticated embodiments and beneficial features thereof are further described herein.

The proposed package for an electric device is based on a substrate that comprises at least a piezoelectric layer. Besides this piezoelectric layer various other layers may be present to form a multilayer substrate. The substrate may be a bulk piezoelectric material or comprise a carrier substrate and functional piezoelectric layer. Such substrates are suitable for forming SAW or BAW devices thereon.

Structures are formed on a first surface of the substrate that is on a surface of the piezoelectric layer device. These device structures are enclosed in an integrally formed package layer structure that is applied on the first surface and comprises at least a mechanical support layer that covers the first surface of the substrate and encloses the device structures in a cavity. A first contact pad is arranged on the first surface of the substrate and electrically connected to the device structures. A second contact pad is arranged on a second surface of the substrate opposite to the first surface. A via is guided through the substrate to interconnect first and second contact pads electrically.

The proposed package combines the benefits of the used thin-film package comprising packaging layers applied directly on the top surface of the device with the possibility to use contact pads disposed on opposite surfaces of the substrate. Those different kinds of contact pads allow to build up stacks by simply connecting these pads for forming an electrically and mechanically connected stack of different substrates.

In an embodiment the mechanically stable support layer comprises a silicon oxide layer that forms domes that enclose the cavities with the device structures arranged therein. Above the domes a protection layer is applied covering at least the support layer. As a topmost layer a barrier layer may cover the protection layer.

According to a first embodiment, the first contact pad is covered by the package layer structure and an external contact of the device structures is provided solely by the second contact pads.

According to a second embodiment, the first pads are exposed in the package layer structure from the first surface side. Hence, contacting the device of this package may be done from the first and/or the second surface side.

The silicon oxide layer provides sufficient mechanical stability to build up suspended domes that provide closed cavities. The further layers applied on the silicon oxide layer provide further mechanical stability and allow a planarizing of the top surface. Plane surfaces are beneficial and ease stacking different substrates one above the other.

The package can be used in a SiP package. In a third embodiment a second similar package is provided having at least a first pad that is exposed on a first surface side according to the second embodiment or having a second contact pad on a second surface of the substrate. The first package according to the first embodiment as described above is connected to the second package by connecting the second pads of the first package with the first or second pads of the second package by bonding via a solder bump, a pillar or a stud bump.

Such stacked packages can be formed on wafer level by stacking respective wafers with a multiple of such electric devices onto one another. First and second package may be stacked with the same orientation that means both packages have the same first or the same second surface as a top surface. The bottom package only needs one type of contact pad exposed that is preferably a second contact pad where the first contact pad is covered by the integrated package layer structure and the top package in the stack only needs second contact pads. A third package that has exposed first and second contact pads on first and second surface thereof may be interposed between first and second package to form a stack of three or more packages. Via their contact pads the different packages in the stack are electrically and mechanically connected with each other. External electrical contacts may be produced on a bottom surface of the bottom package or on a top surface or the top package.

In a preferred embodiment the device structures are part of a SAW device or a BAW device that need a cavity for undisturbed operation. Such a cavity is provided by the integrally formed package layer structure. But other MEMS devices or any other electronic device may be used for the proposed package. In a preferred embodiment such a stack of substrates comprises a stack of wafers as first, second or any higher substrate.

From such a stack thin electric devices can be singulated, for example by dicing using a saw or a similar separation tool. Other methods that are for suitable for singulating comprise dicing before grinding (DBG), laser-cutting, plasma-etching and similar methods.

According to the invention a method for manufacturing such a package for an electronic device is proposed. This method comprises the steps of A) providing a first wafer comprising a piezoelectric layer
B) forming device structures for a multitude of electric devices in parallel on a first surface of the first wafer and first pads connected to the device structures
C) applying over the device structures an integrated package layer structure that seals to the first surface and forms cavities between layer structure and first surface of wafer to enclose device structures within the cavity
D) reducing the thickness of the wafer from the second surface opposite to the first surface
E) forming holes in the second surface to a depth until bottom parts of the first pads are exposed
F) depositing a metallization on the second surface electrically contacting the first pad in the holes
G) forming second pads on the second surface or from the metallization.

For forming BAW devices, steps A) and B) comprise providing a carrier substrate, forming a first (bottom) electrode layer, forming a piezoelectric layer as a first functional layer and forming a second (top) electrode layer on top of the piezoelectric layer.

After forming the integrated package layer structure the substrate provides enough mechanical stability to be thinned in step D). With a thinner substrate the forming of holes is facilitated. The holes are formed in the second surface just below the first contact pads such that the first contact pads can function as a stop layer in the hole-forming process.

The metallization deposited in step F) forms an electrically conducting connection between the first contact pad in the bottom of the hole and the metallization applied on the second surface of the substrate. The metallization may comprise one or more layers of the same or different metals. The second pads formed on the second surface on or from the metallization may be thickened by a plating process or any other metal deposition technique.

In a preferred embodiment the forming of holes in step E) comprises ablation of material from the wafer by a drilling process, by an etching process or by using a laser beam to ablate material from the wafer. In all cases it is advantageous to provide the first contact pads with a thickness that is higher than that of a normal contact pad to facilitate the hole-forming process without damaging the function of the first contact pad.

According to another embodiment a second wafer is provided by performing the steps A) to G) at the second wafer. Then, first and second wafer are arranged in a stack such that their second surfaces are facing and contacting each other. Then, second contact pads of first and second wafer are directly connected to each other.

In this arrangement the first contact pads of first and second wafer are not necessary for external contact and may remain covered by the package layer structure. But one of first and second wafer may provide exposed first contacts for external contact of the arrangement. On the first surface a first contact pad that remains unexposed can be made with a smaller area than a pad that is used for an external contact by a bump or any other solder connection. Hence, the proposed arrangement has less area consumption on the first surface for the contact pads and provides or leaves more area for the device structures. Alternatively, the total required surface area for the electric device structures is smaller and hence, smaller electric devices are achievable.

According to an alternative stacking method a second wafer is provided by performing steps A) to D). Then, in a step H2) first pads of the second wafer are exposed. In a step J2) first and second wafers are arranged in a stack where the second surface of the first wafer faces the first surface of the second wafer. Then, the second pads of the first wafer are directly connected to the first pads of the second wafer. The connection can be done by a solder bump, a stud bump, a pillar or any other wafer or chip connecting method.

Singulation of single electric devices from a stack of wafers can be facilitated by the following steps performed after step C):

C1) forming trenches in the first surfaces of the first and the second wafer thereby dividing different areas of the later single devices
C2) temporarily bonding the first surface of the first wafer to a temporary carrier
D) reducing the thickness of the first wafer from the second surface to expose the trenches from the bottom
E) forming holes in the second surface of the first wafer opposite to the first pads to a depth until the bottom parts of the first pads are exposed F) depositing a metallization on the second surface of the first wafer, thereby electrically contacting the first pads in the holes G) forming second pads on the second surface of the first wafer on or from the metallization H2) exposing the first pads of the second wafer J2) arranging first and second wafer in a stack where the second surface of the first wafer faces the first surface of the second wafer, thereafter directly connecting the second pad of the first wafer and the first pads of the second wafer K2) reducing the thickness of the second wafer from the second surface to expose the trenches from the bottom.

The trenches are formed in step C1) to a depth that is smaller than the thickness of the wafer. Hence, the wafer still has enough mechanical stability to be handled. In step D) the thickness reduction comprises removing wafer material from the second surface until the trenches are exposed. Then, all single devices are separated from each other but are still mounted together on the temporary carrier. Hence, all further steps of the manufacturing process can be applied to all single devices in parallel like on a wafer despite being separated from each other but only connected by the temporary carrier they are mounted to.

In an embodiment, step C) of the manufacturing method comprises forming a barrier layer as a topmost layer of the package layer structure wherein the barrier layer is chosen from a metal layer, an SiN layer and any other layer that can function as a barrier against humidity. The package layer structure can seal to the respective first surface of the wafer between the domes enclosing the cavities over the device structures. A perfect sealing can be achieved if the barrier layer too seals to the surface of the wafer such that all further package layers are covered and sealed between surface of wafer and barrier layer. The trenches are then arranged in those areas where the barrier layer seals to the surface and the forming of trenches does not have an impact on the sealing properties of the barrier layer.

According to a further development, steps F) and G) comprise the step of forming a distribution layer in or on the metallization on the second surface of a respective wafer. Second pads are formed that are laterally shifted relative to the first pads. A conductor line of the redistribution layer electrically connects second pads to the metallization in the holes and hence connects the second pads to the respective first pads.

The redistribution layer has the advantage that the footprint on the second surface needs not comply with the "footprint" of the first pads on the first surface. Hence, placement of second contact pads can be made independently from the placement of the first contact pads that are controlled by the device structures and cannot freely be chosen. Within such a redistribution layer an electrical connection of different first pads of one and the same electric device can be done, thereby saving additional surface area on the first surface where such a connection is then not required.

The proposed method allows to form wafer stacks and substrate stacks of more than two wafers. Hence, the method comprises the step of preparing a third or a fourth wafer and bonding the third or fourth wafer on respective second pads of the already formed stack of first, second or a higher numbered wafer. In such a higher stack any intermediate wafer that is a wafer that is disposed between two adjacent wafers on top and on the bottom of the wafer needs to have two types of pads, that is first contact pads on the first surface and second contact pads on the second surface to allow electrical connection to the upper and the lower wafer respectively.

If a wafer with prepared trenches in the first surface thereof is bonded to a temporary carrier with the first surface, the carrier is advantageously selected with the same or a similar thermal expansion behavior. Only then can stress that is due to different coefficients of thermal expansion be avoided that may damage the device structures and hence the division of the devices.

After complete manufacture of the devices that are still bonded to the temporary carrier the single devices that are already separated can be picked up or debonded from the temporary wafer and further mounted to a reel.

In the following the invention is further explained by specific embodiments and the accompanying figures. The figures are schematic only and not drawn to scale such that features may be depicted enlarged or reduced in dimension such that no relative dimensions of different features can be taken from the figures.

FIG. 1 shows a first embodiment of a package in a cross-sectional view;

FIG. 2 shows the second embodiment of a package in a cross-sectional view;

FIG. 3 shows a stack of two packages;

FIG. 4 shows a stack of three packages;

FIG. 5 shows different steps of a method of manufacturing such a package;

Figure 6:
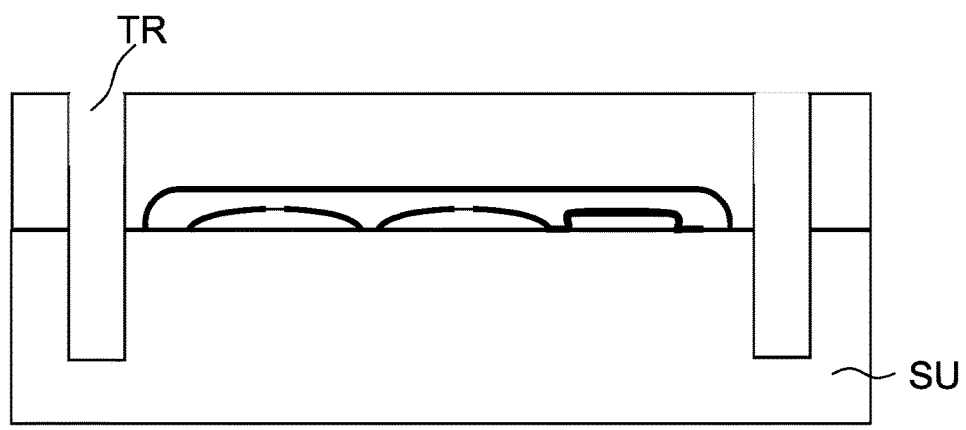
FIG. 6 shows a stage after producing the trenches.

FIG. 1 shows a cross-section of a first embodiment of a package 1. A substrate SU at least comprises a piezoelectric layer or may be totally made of a piezoelectric material. On top of the substrate SU, that is on the first surface S1 thereof, device structures for an electric device are arranged and connected to a first contact pad P1. For the sake of simplicity, the device structures are not shown in the figure. The device structures as a whole or part of the devices structures are arranged in a cavity between a package layer structure PK and the first surface S1 of the substrate SU. The package layer structure PK is applied onto the first surface S1 and forms domes that enclose the cavity between the package layer structure PK and the first surface S1. The cavities allow the free operating of device structures that are sensitive to mechanical impact.

The package layer structure PK comprises at least a mechanical support layer SL, the at least one dome and may comprise further layers deposited thereon to further mechanically stabilize the package layer structure PK. An outermost layer of the package layer structure may be a barrier layer BL that forms a barrier against humidity. The barrier layer may also comprise a metal to function as a shield against electromagnetic fields.

On a second surface S2 of the substrate SU a metallization is applied forming at least a second contact pad P2. A via V is guided through the substrate SU just opposite to the first pad P1 and connects this first pad to the metallization on the second surface S2. On the metallization at least the second contact pad is formed.

In the figure, two cavities are shown. However, an electric device may comprise an arbitrary number of domes/cavities for example one or more than two domes dependent on the size and number of the device structures. The first contact pads P1 have a thickness that is higher than the thickness of a normal contact pad because during manufacturing of the package it has to function as a stopping layer when forming the holes. The device structures may require two or more electric terminals and hence are connected to two or more first pads P1. Each first pad P1 is connected to a second pad P2 on the second surface S2 by means of a via V formed through the substrate SU.

The figure shows a section of the substrate that carries device structures for one electric device. Preferably the substrate SU is a wafer carrying a multitude of such device structures each covered by a package layer structure. Alternatively, the package layer structure may be a common one for all device structures on the same wafer.

FIG. 2 shows a second embodiment of a package 1' similar to the package 1 of the first embodiment with the exception that an opening OP is formed above the first pad P1 and exposes the surface thereof. The barrier layer BL may or may not seal to the surface of a first pad P1 at the sidewalls of the opening OP. Hence, the depicted package 1' offers free access to a first and a second pad P1, P2 and allows connection of the package with the pads on the first surface S1 or the second surface S2.

FIG. 3 shows a third embodiment of the invention where a package of the first embodiment and a package 2 of the second embodiment are stacked on one another and connected via two pads of different kind. The first substrate SU1 is connected via its second pad P2 on the second surface S2 thereof to the first pad P1 of a second substrate SU2. The second substrate SU2 still has a freely accessible second pad P2 on a second surface. The electrical connection between first and second substrate is done by means of connection means CM that are formed as solder balls, bumps, stud bumps or pillars. The mounting of the first substrate SU1 to the second substrate SU2 is done by simultaneously connecting all second pads P2 of the first substrate SU1 to respective first pads P1 of the second substrate SU2. Hence, stacking and mounting of two packages can be done on wafer level.

The arrangement shown in FIG. 3 has the advantage that the first substrate SU1 on top of the arrangement need not expose a freely accessible first pad P1 on the topmost surface thereof. Hence, this first substrate or first package saves the surface area that would be otherwise required for an accessible solderable pad. The surface area saved on the first surface can advantageously be used for arranging there device structures or for miniaturizing the first package by a respective amount.

Deviating from the package structure of the second embodiment shown in FIG. 2, the second substrate SU2 of FIG. 3 need not necessarily have a second pad P2 and hence need not have a via V for connecting first and second pad. External contact of the arrangement can be made by another contact or contact structure.

FIG. 4 shows another arrangement where three packages, as shown in FIGS. 1 and 2, are stacked one above the other and electrically and mechanically connected by connecting means CM. The stack can be achieved by mounting the stack of FIG. 3 via the second pads of the second substrate SU2 to the first pads of a third package formed according to the second embodiment as shown in FIG. 2. Here again, the topmost package made on the first substrate SU1 does not provide an access to the first contact pad that is covered by the package layer structure PK. The arrangement of FIG. 3 provides the same benefit.

Also in this arrangement the bottom package/substrate SU3 does neither require a second pad P2 nor a via connecting a second pad to a respective first pad P1.

The stacked arrangements shown in FIGS. 3 and 4 form a system in a package and allow a three-dimensional integration of electric devices that is space-saving and can be miniaturized with respect to an arrangement comprising only laterally arranged devices.

FIG. 5 shows different stages of a method of manufacturing a package as shown in FIG. 1. The process starts from a substrate SU comprising at least a piezoelectric layer or being a piezoelectric material. On the first surface S1 thereof, device structures are arranged and connected to a first pad P1. Device structures and first pad P1 are made from different metallizations or are at least different in height as the first pad P1 has a substantially higher thickness than the metallization of the device structures.

In case of a SAW device the device structures may be covered with a layer that reduces the TCF (=thermal coefficient of frequency). Such a layer can be formed as an $SiO_2$ layer of about 1.5 μm thickness. A trimming layer of e.g. SiN can cover the TCF reducing layer.

The structures are then covered with a sacrificial layer SC that can be applied to the entire first surface S1 and is then structured to cover only the device structures to be protected thereunder. Alternatively, the sacrificial layer SC may be applied exclusively at those locations where it is needed. FIG. 5a shows such a structured sacrificial layer.

In a next step the structured sacrificial layer SC is covered by a mechanically stable support layer SL. The support layer can be deposited on the entire surface of the first surface of the substrate SU but may be structured to cover only the sacrificial material of the sacrificial layer SL plus a margin around these islands of sacrificial material SC. In a preferred example, the support layer SL comprises an $SiO_2$ layer of about 3 μm thickness applied in a sputter process. The support layer SL may be structured if required by a photolithography and a dry etching process.

In the next step release holes are formed through the support layer SL and the sacrificial material is removed through the release holes, for example by wet etching. FIG. 5B shows the arrangement in this state.

In the next step the release holes are closed by applying a proper closing material on the release holes such that the cavity CV is closed. Then, further layers of the package layer structure can be applied. One of these layers may be a polymer layer like BCB of about 9 μm thickness that can easily be planarized so that a plane surface remains on top of the package layer structure PK. The topmost layer is a barrier layer BL that preferably seals to the first surface S1 of the substrate SU. The barrier layer can comprise SiN or a metal. FIG. 5C shows the arrangement at this stage.

In the next step the substrate SU may be thinned in a proper process, for example by grinding. The resulting final thickness of the substrate is chosen to provide reliable device operation and further to maintain sufficient mechanical stability to handle the substrate/package. If the substrate SU is a piezoelectric layer and device structures for a SAW or a BAW device are present, an exemplary thinned substrate thickness is chosen at 60 to 70 μm. FIG. 5D shows the arrangement with the respectively thinned substrate SU.

In the next step holes HL are formed from the second surface side S2 through the substrate to expose the bottom side of the first contact pad P1. These holes HL may be formed by a wet or dry etching process or are directly formed by using a laser beam. In the latter case, the sidewalls of the hole HL are inclined against the surface to have a smaller cross-section at the first contact pad side on the first surface S1. FIG. 5E shows the arrangement at this stage.

In the next step a metallization is applied to the second surface S2 to at least cover the sidewalls and contact the first contact pad from the bottom, respectively from the side of the second surface S2. A metallization ME may be applied to the entire second surface S2 and then structured. Alternatively, a first partial layer of the metallization can comprise a sputter deposited adhesion layer of Ti and a sputtered seed layer of copper. A photoresist mask can be applied to the entire metallized surface and then a plating process is performed to thicken the metallization in the exposed areas of the resist mask. Thereby a second contact pad P2 preferably formed of Cu and having a thickness of about 5 μm is formed on the metallization. The pad can be completed by applying an under bump metallization comprising a solderable metal as a top layer for example Au. Other solderable layers may be used instead comprising one of Ni and Ag. On such solderable layers solder bumps or copper pillars or stud bumps can be applied for making an electric contact. FIG. 5F shows the arrangement at this stage.

The metallization can comprise one or more layers and at least one of them is a conducting layer. Other useful deposition techniques comprise PVD, CVD, galvanic or chemical deposition. Another method is spraying a suspension of electrically conducting nanoparticles and subsequently vaporizing the solvent. The metallization may be applied directly in a structured form by using suitable masks applied on the surface of the substrate.

If a photoresist has been used this can be removed in a wet chemical process or in a plasma.

In the next step solder bumps, stop bumps or other connection means are applied on the second surface by means of stencil printing, for example with subsequent reflow, or via a photo-technique in a galvanic process.

Now the electric device is ready to be mounted into a desired final circuit or for being prepared for storage and transport.

Figure 7:
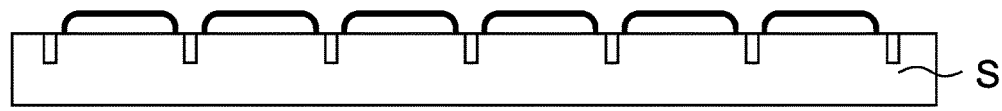
FIG. 7 shows a wafer with trenches that divide the total surface area into smaller areas, each for a single electric device.
Figure 8:
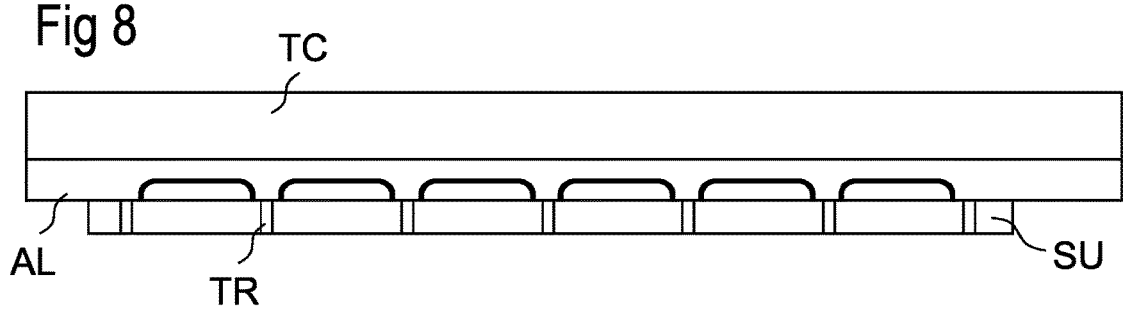
FIG. 8 shows a package on wafer level after thinning of the substrate.

FIGS. 6 to 8 show process steps that can be used to singulate single electric devices from a wafer comprising a multiple of such devices.

FIG. 6 shows part of a wafer substrate SU with a package layer structure PK applied on the first surface S1 that covers the device structure of the electrical device. As shown in this embodiment a further planarizing layer PL can applied onto the package layer structure as shown in FIG. 5F or FIG. 1, for example. To facilitate the singulation process trenches are formed from the first surface side through all layers of the package layer structure PK and through a part of the layer thickness of the substrate SU. The trenches TR follow separation lines that divide the single devices from each other. FIG. 6 shows the arrangement after forming the trenches. For the sake of simplicity only one device is shown from the whole wafer.

FIG. 7 shows a greater section from such a wafer where the package layer structure is only depicted schematically and simplified. All trenches are cut into the substrate to the same depth. Here, the further planarizing layer is omitted.

In the next step the arrangement is stabilized by bonding the arrangement to a temporary carrier TC in a suitable bonding process. FIG. 8 shows a connection by means of a thermo-adhesive layer AL. The package is embedded into the thermo-adhesive layer AL on the temporary carrier TC that has been softened in a thermal step.

A preferred temporary carrier TC is adapted to the substrate material in view of its coefficient of thermal expansion to avoid thermal stress when subjecting the arrangement to a thermal process during further processing.

In the next step the thickness of the substrate is reduced by thinning the substrate wafer from the second surface until the trenches are exposed from the bottom. This can be done by grinding followed by a possible step of chemical-mechanical polishing CMP. FIG. 8 shows the arrangement at this stage.

Alternatively, in cases where only a thin piezoelectric layer is arranged on a carrier substrate like a Si wafer the step of forming trenches may comprise forming trenches in the first surface of the substrate that cut only through the piezoelectric layer. After thinning the substrate from the second surface side these trenches are not yet exposed.

In a further alternative process variant the step of forming trenches is totally omitted in cases where only a thin piezoelectric layer is arranged on a carrier substrate.

In both alternating variants with no trenches or with trenches only through the piezoelectric layer the singulation of the substrate into single devices is done by laser cutting or plasma etching from the second surface side after complete processing of the second surface as explained later on in connection with FIG. 8. Such further processing comprises forming a redistribution layer on the second surface, further structuring of the redistribution layer and forming a UBM on the second pads. In this case further proceeding on the second surface can be done before singulation step and hence no temporary carrier or mounting foil is required.

The arrangement shown in FIG. 8 can now be subjected to process steps as shown in connection with FIGS. 5E and 5F. Thereby holes are formed through the substrate to expose first pads on the first surface from the bottom and a metallization is deposited on the second surface and second pads are formed on or in the metallization.

When the second pads P2 are completed the total wafer arrangement that is already bonded to the temporary carrier can be mounted to another wafer by connecting it to the first or second pads of the other wafer.

It is possible to attach and fix a mounting foil or another temporary carrier to the first surface before singulating the substrate from the second surface to further proceed on a "wafer level" despite the fact that the devices have already been singulated. With the help of the mounting foil a multitude of single devices can be processed in parallel the same way as with a wafer. On the mounting foil the same mutual arrangement of single devices like on a wafer is kept.

Figure 9:
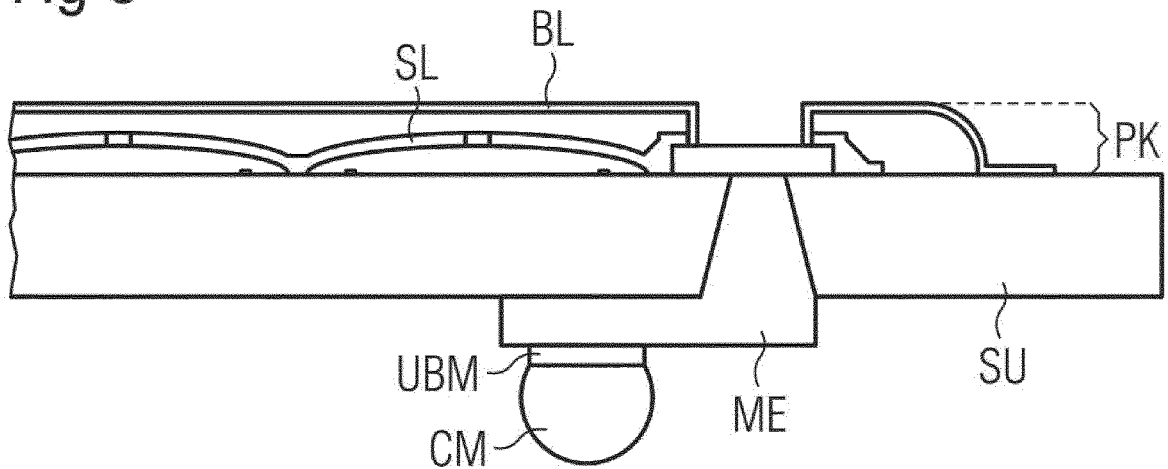
FIG. 9 shows the package the second embodiment after forming a second pad and a bump thereon.

FIG. 9 shows a package according to the first embodiment after bumping or after applying a connection means to the metallization ME at the second pad. Between pad and connection means/bump an under bump metallization UBM is applied. The barrier layer may be a metal that an electromagnetic shield is formed. The barrier layer then seals and contacts to the exposed first pad.

The proposed package shows at least the following advantages:
  Minimal possible physical size of the devices/chips
  Smallest contact pad size on the first surface being the functional wafer side.
  Maximal possible flexibility for arranging contact pads and bump layout due to the redistribution layer RDL.
  Absolute hermeticity of package due to unstructured SiN or metal outer layer on top of the package or the topmost package when stacking a multiple of packages.
  Possibility of forming metal shield for protection from electro-magnetic field and heat transport as a topmost layer of package or stack.

Compatibility with standard and 180 μm bump pitch techniques and Cu-pillar process.

Possibility of enhancing of dome strength and package stability with Cu-posts or frames that are auxiliary supporting metal structures that can be formed in the same step and together with the forming of the pads.

Highest standoff for existing SAW packages when contacting second pads to an external circuit like a PCB. This high stand-off is advantageous in an optional subsequent molding or underfill step.

The package can be stacked with the same or similar package (DSSP, TFAP1, TFAP2). Different types of packages may be stacked on the same substrate.

If the same package is used, several different layer stacks are possible with the same approach.

The package can be used for any wafer material: LN, LT, Si.

In case the substrate comprises a Si wafer as used for BAW or thin film SAW devices further integration with semiconductor chips is possible.

Despite having shown only a few embodiments the invention is not restricted to the embodiments and the figures. The broadest definition of the invention can be taken from the independent claims.

| List of used reference symbols | |
|---|---|
| 1,1' | package |
| AL | adhesive layer |
| BL | barrier layer |
| CM | connection means |
| CV | cavity |
| HL | hole |
| ME | metallization |
| ME | metallization |
| OP | opening in PK to expose P1 |
| P1 | first contact pad |
| P2 | second contact pad |
| PK | package layer structure |
| PL | planarization layer |
| PR | protection layer |
| RDL | redistribution layer |
| S1 | first surface |
| S2 | second surface |
| SC | sacrificial layer |
| SL | mechanical support layer |
| ST | stack of first and second wafer |
| SU | substrate with piezoelectric layer |
| TC | temporary carrier |
| TR | trench |
| V | via |

The invention claimed is:

1. A package for an electric device, comprising:
a substrate comprising at least a piezoelectric layer;
operational device structures on a first surface of the piezoelectric layer;
an integrally formed package layer structure on the first surface comprising at least a mechanical support layer covering the first surface of the substrate and enclosing the operational device structures in a cavity;
a first contact pad on the first surface of the substrate electrically connected to the operational device structures;
a second contact pad on a second surface opposite to the first surface;
a via through the substrate and electrically interconnecting the first contact pad and the second contact pad; and
a barrier layer over at least the mechanical support layer and having an opening for coupling the first contact pad to another substrate.

2. The package of claim 1, wherein:
the mechanical support layer comprises a silicon oxide layer that forms domes enclosing the operational device structures;
a protection layer covers the mechanical support layer;
the barrier layer covers the protection layer; and
the first contact pad is exposed on the first surface.

3. The package of claim 1, wherein the first contact pad is covered by the package layer structure, and wherein an external contact of the operational device structures is provided solely by the second contact pad.

4. The package of claim 1, wherein:
the package is connected to the other substrate by connecting the first contact pad with a third contact pad of the other substrate by bonding via a solder bump, a pillar, or a stud bump through the opening of the barrier layer.

5. The package of claim 1, wherein the operational device structures are part of a surface acoustic wave (SAW) device or a bulk acoustic wave (BAW) device.

6. The package of claim 1, wherein the substrate is a wafer comprising the electric device.

7. A method of manufacturing a package, comprising:
forming device structures for electric devices on a first surface of a first wafer and forming first pads connected to the device structures, the first wafer comprising a piezoelectric layer;
applying, over the device structures, an integrated package layer structure that seals to the first surface and forms a cavity between the integrated package layer structure and the first surface of the first wafer to enclose device structures within the cavity, wherein the integrated package layer includes a mechanical support layer;
reducing a thickness of the first wafer from a second surface opposite to the first surface;
forming holes in the second surface to a depth until the bottom parts of the first pads are exposed;
depositing a metallization on the second surface electrically contacting the first pads in the holes; and
forming second pads on the second surface, wherein applying the integrated package layer structure includes forming a barrier layer over at least the mechanical support layer and having an opening for coupling the first pads to another substrate.

8. The method of claim 7, wherein forming the holes comprises ablation of material from the first wafer by drilling, etching or by using a laser beam.

9. The method of claim 7, further comprising:
arranging the first wafer and a second wafer in a stack, wherein the second surface of the first wafer is facing a surface of the second wafer; and
directly connecting the second pads of the first wafer with pads of the second wafer.

10. The method of claim 7, further comprising:
exposing pads of a second wafer; and
arranging the first wafer and the second wafer in a stack, wherein the second surface of the first wafer faces a surface of the second wafer; and
directly connecting the second pads of the first wafer and the pads of the second wafer.

11. The method of claim 7, further comprising:
forming trenches in the first surface of the first wafer and a surface of a second wafer;

bonding the first surface of the first wafer to a temporary carrier, wherein reducing the thickness of the first wafer from the second surface exposes the trenches;

forming the second pads on the second surface on or from the metallization;

exposing the first pads of the second wafer;

arranging the first wafer and second wafer in a stack where the second surface of the first wafer faces the first surface of the second wafer and directly connecting the second pads of the first wafer and the first pads of the second wafer; and reducing the thickness of the second wafer from the second surface to expose the trenches in the second wafer.

12. The method of claim 7, wherein the first wafer comprises a thin piezoelectric layer on a carrier substrate wherein the method further comprises:

forming trenches that cut only through the piezoelectric layer after applying the integrated package layer structure.

13. The method of claim 7, wherein applying the integrated package layer structure comprises forming the barrier layer as a topmost layer of the integrated package layer structure, and wherein the barrier layer is a metal layer, a SiN layer, or any other layer that can function as a barrier against humidity.

14. The method of claim 7, wherein depositing the metallization and forming the second pads comprise forming a redistribution layer in or on the metallization and forming the second pads that are laterally shifted relative to the first pads, and wherein a conductor line of the redistribution layer electrically connects the second pads to the metallization in the holes.

15. The method of claim 7, further comprising preparing a second wafer and bonding the second wafer on the second pads.

16. The method of claim 11, wherein the temporary carrier comprises a same material as the first wafer, and wherein the temporary carrier is separated from the first wafer after reducing the thickness of the second wafer.

* * * * *